(12) United States Patent
Wermter

(10) Patent No.: US 12,082,358 B2
(45) Date of Patent: Sep. 3, 2024

(54) ELECTRICAL DEVICE HAVING A LOCKING DEVICE

(71) Applicant: Phoenix Contact GmbH & Co. KG, Blomberg (DE)

(72) Inventor: Peter Wermter, Blomberg (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 339 days.

(21) Appl. No.: 17/764,552

(22) PCT Filed: Oct. 2, 2020

(86) PCT No.: PCT/EP2020/077626
§ 371 (c)(1),
(2) Date: Mar. 29, 2022

(87) PCT Pub. No.: WO2021/064158
PCT Pub. Date: Apr. 8, 2021

(65) Prior Publication Data
US 2022/0346255 A1    Oct. 27, 2022

(30) Foreign Application Priority Data
Oct. 2, 2019 (DE) ...................... 10 2019 126 628.9

(51) Int. Cl.
*H05K 5/02* (2006.01)
*E05B 65/52* (2006.01)
*H05K 7/14* (2006.01)

(52) U.S. Cl.
CPC ........... *H05K 5/0221* (2013.01); *E05B 65/52* (2013.01); *H05K 5/0208* (2013.01); *H05K 7/1405* (2013.01)

(58) Field of Classification Search
CPC ........................................................ H05K 7/00
See application file for complete search history.

(56) References Cited

U.S. PATENT DOCUMENTS 7,230,833 B1 * 6/2007 Sickels ................ H05K 7/1474
361/740
2018/0206351 A1 * 7/2018 Wu .......................... E05C 19/06

FOREIGN PATENT DOCUMENTS

DE            9400887 U1    5/1995
DE     102008021210 B4    7/2010
(Continued)

*Primary Examiner* — Jerry Wu
(74) *Attorney, Agent, or Firm* — LEYDIG, VOIT & MAYER, LTD.

(57) ABSTRACT

An electrical device includes: a first housing sub-assembly; a second housing sub-assembly that has a housing wall; and a locking device. The first housing sub-assembly and the second housing sub-assembly are positionable adjacent to one another along a plug-in direction and, when in a position in which they are adjacent to one another, are interlocked via the locking device. The locking device has an actuation element arranged on the second housing sub-assembly so as to be adjustable along an actuation direction, and a locking element connected adjustably to the housing wall and operatively connected to the actuation element. The locking element is configured, in the position of the housing sub-assemblies in which they are adjacent to one another, to interlock the first housing sub-assembly and the second housing sub-assembly, and, by moving the actuation element in the actuation direction towards the housing wall, are movable in an unblocking direction.

18 Claims, 10 Drawing Sheets

(56) References Cited

FOREIGN PATENT DOCUMENTS

DE 102014102733 B4 12/2015
EP 2503864 A2 9/2012
WO WO 2004114466 A1 12/2004

* cited by examiner

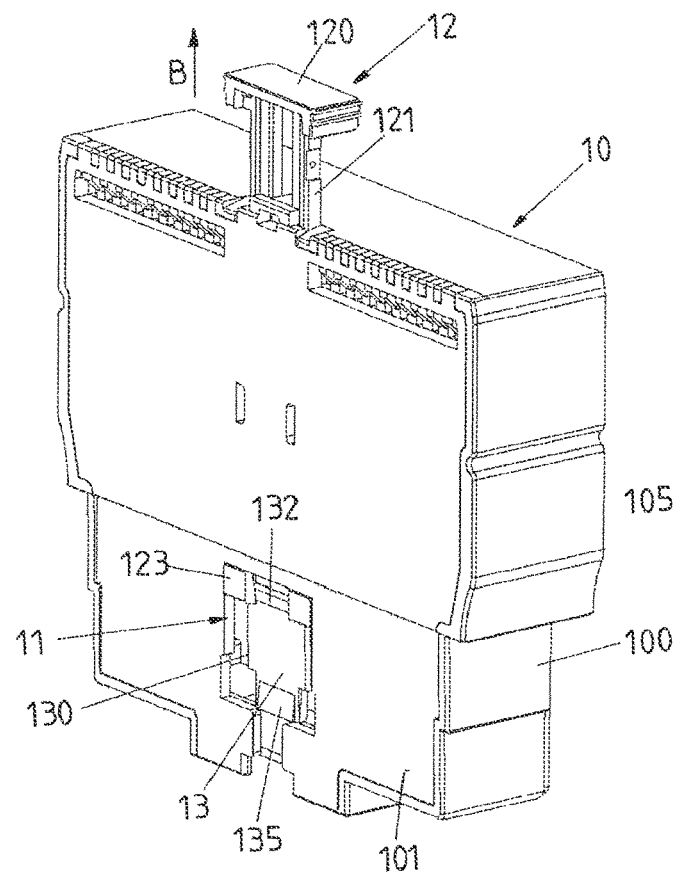
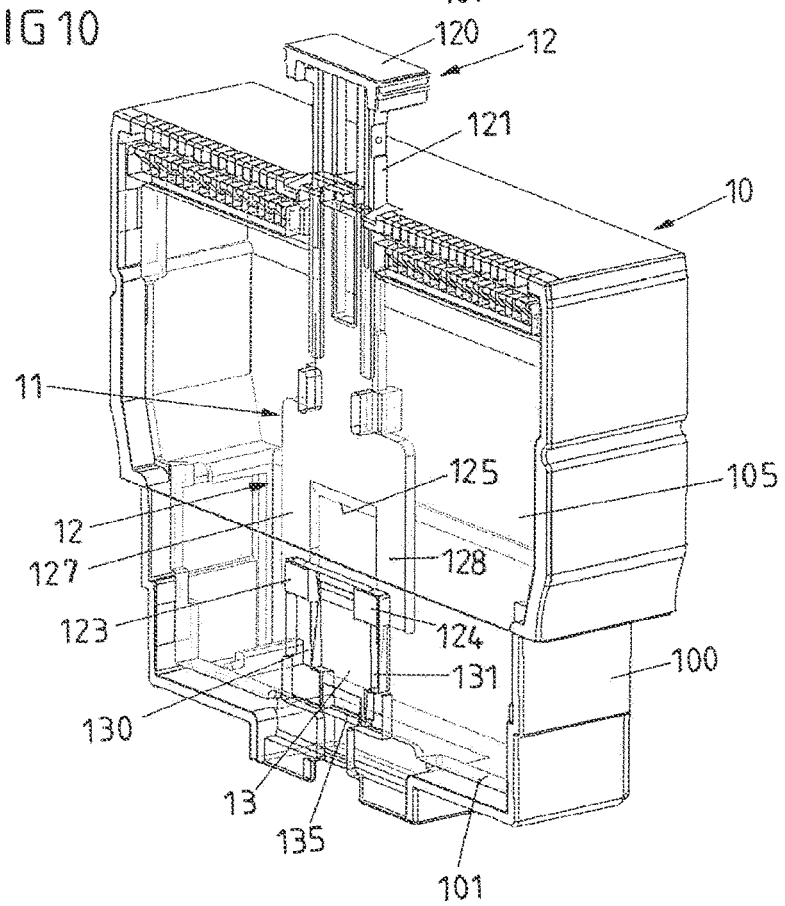

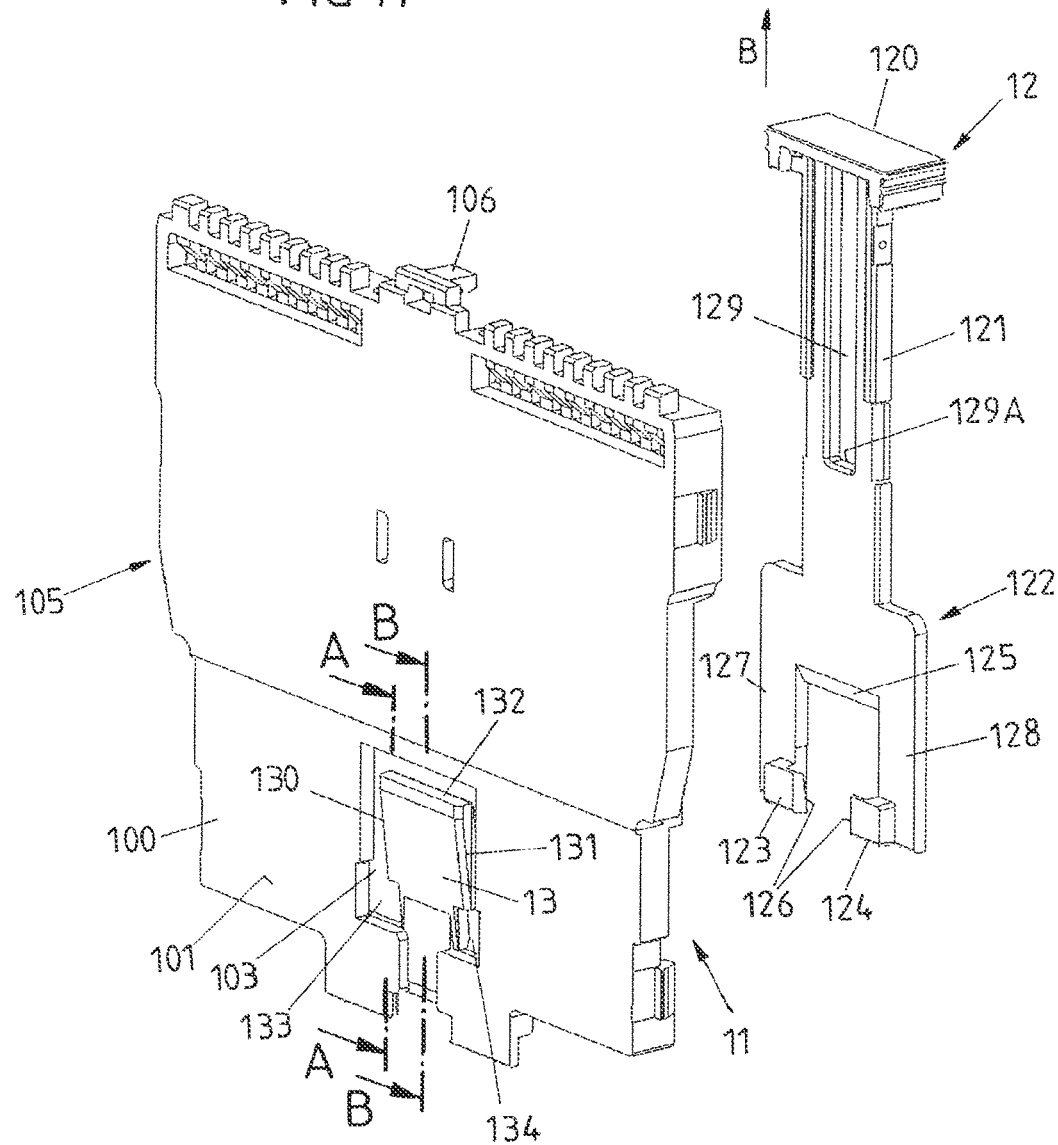

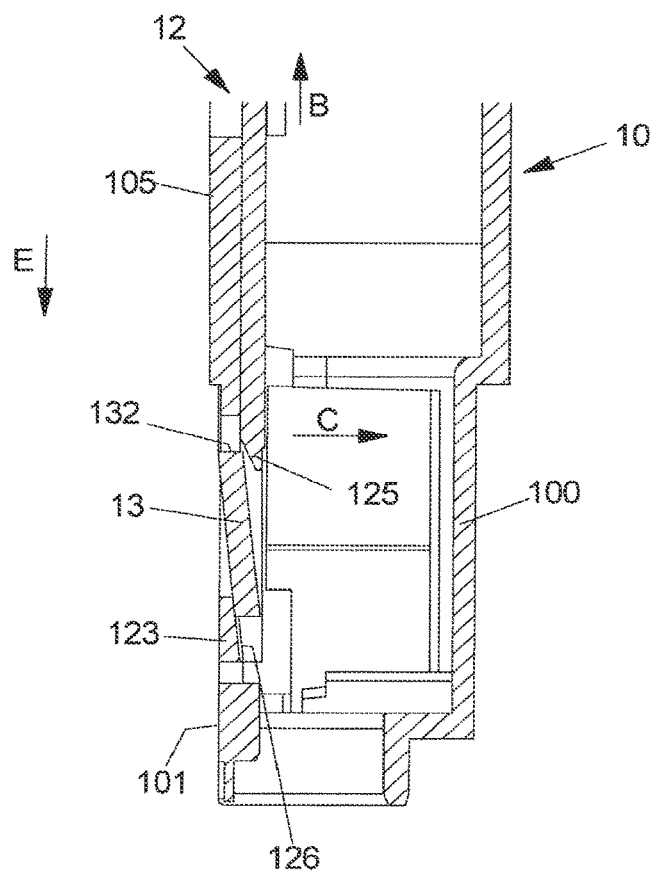
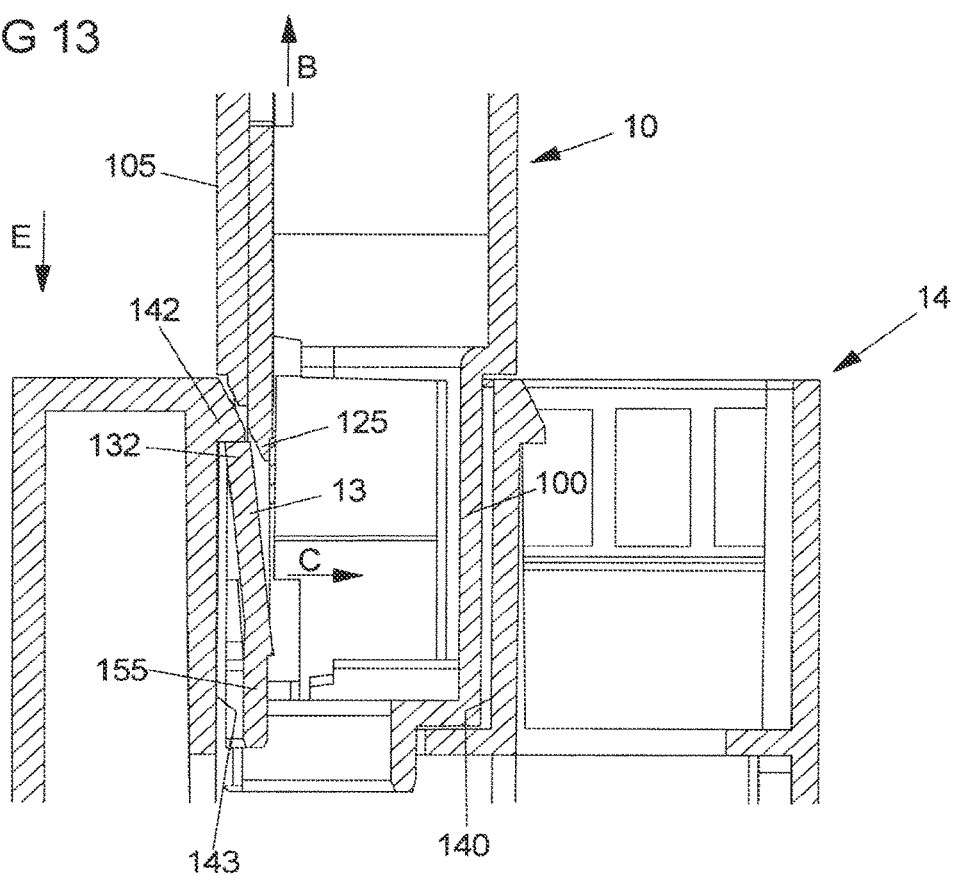

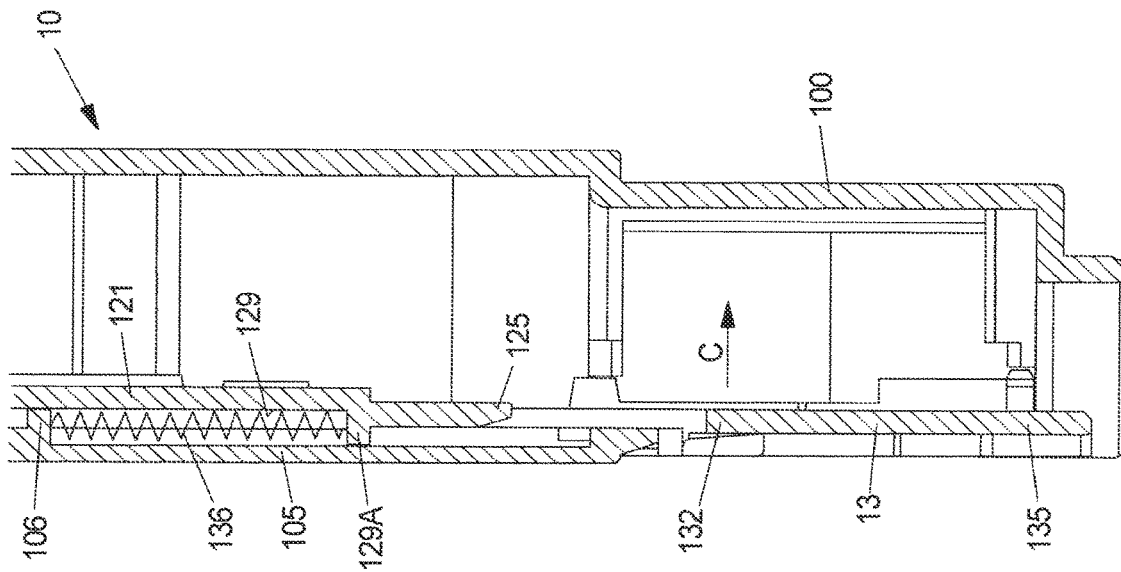
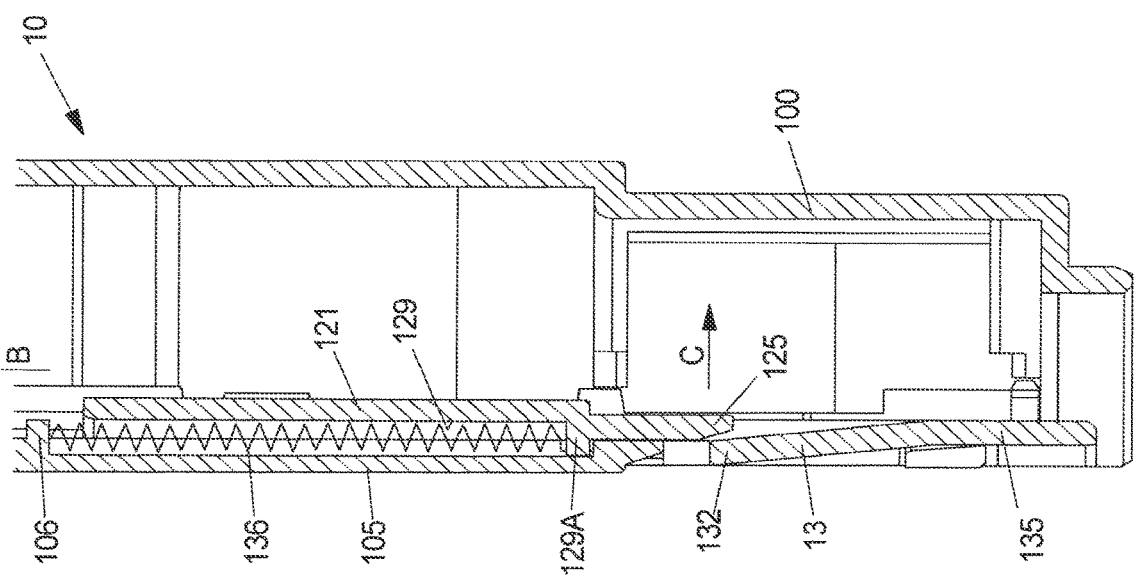

ELECTRICAL DEVICE HAVING A LOCKING DEVICE

CROSS-REFERENCE TO PRIOR APPLICATIONS

This application is a U.S. National Phase application under 35 U.S.C. § 371 of International Application No. PCT/EP2020/077626, filed on Oct. 2, 2020, and claims benefit to German Patent Application No. DE 10 2019 126 628.9, filed on Oct. 2, 2019. The International Application was published in German on Apr. 8, 2021 as WO 2021/064158 under PCT Article 21(2).

FIELD

The invention relates to an electrical device.

BACKGROUND

Such an electrical device can be used, for example, in the field of automation technology, such as in an industrial plant—for example, in a production plant. Such an electrical device can be mounted, for example, in a switchgear cabinet and for this purpose, for example, can be arranged on a mounting rail inside a switchgear cabinet or on another fastening device. Such an electrical device can usually be combined with other electrical devices, e.g., by arranging electrical devices in series with each other, in order in this way to create an electrical functional group for automation functions, e.g., for controlling actuators, for processing sensor signals, and for a power distribution, e.g., for an electrical supply.

An electrical device of the type described here comprises a first housing sub-assembly and a second housing sub-assembly having a housing wall. The housing sub-assemblies can be positioned adjacent to one another and, when in a position in which they are adjacent to one another, are interlocked via a locking device in such a way that the housing sub-assemblies are held together, but can be detached from each other by unlocking the locking device.

In the case of such an electrical device, the housing sub-assemblies should be easily to position adjacent to one another and, when adjacent to one another, should lock securely and reliably to each other. An actuation of the locking device for unlocking should be possible in a simple and comfortable manner, with a simple design of the locking device.

In an electrical device known from DE 197 10 768 C2, a base can be attached to a mounting rail. A housing sub-assembly can be connected to the base, wherein, in the connected position, an electrical connection exists between the base and the housing sub-assembly, and the housing sub-assembly is also latched to the base via a latching hook.

In an electrical device known from DE 197 44 662 C1, housing sub-assemblies can be positioned adjacent to one another and are interlocked in a connected position, wherein one of the housing sub-assemblies is to be fastened to a mounting rail, and the other of the housing sub-assemblies can have connections for connecting electrical conductors, for example.

SUMMARY

In an embodiment, the present invention provides an electrical device, comprising: a first housing sub-assembly; a second housing sub-assembly that has a housing wall; and a locking device, wherein the first housing sub-assembly and the second housing sub-assembly are positionable adjacent to one another along a plug-in direction and, when in a position in which they are adjacent to one another, are interlocked via the locking device, wherein the locking device has an actuation element arranged on the second housing sub-assembly so as to be adjustable along an actuation direction, and a locking element connected adjustably to the housing wall and operatively connected to the actuation element, and wherein the locking element is configured, in the position of the housing sub-assemblies in which they are adjacent to one another, to interlock the first housing sub-assembly and the second housing sub-assembly, and, by moving the actuation element in the actuation direction towards the housing wall, are movable in an unblocking direction, oriented transversely to the actuation direction, towards the housing wall in order to release the lock.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 9 is a view of the housing sub-assembly according to FIG. 7, with an actuation element in an actuation position;

FIG. 10 is a partially transparent view of the housing sub-assembly according to FIG. 9;

FIG. 11 is a separate view of a housing wall and the actuation element arranged thereon;

FIG. 12 is a sectional view along the line A-A according to FIG. 11, in a locking position;

FIG. 13 is a sectional view along the line B-B according to FIG. 11, in the locking position;

FIG. 16 is a sectional view of an exemplary embodiment, in which the actuation element is spring-pretensioned by means of a spring element, in the locking position; and FIG. 17 is a sectional view according to FIG. 16, with the actuation element in the actuation position.

DETAILED DESCRIPTION

Figure 1:
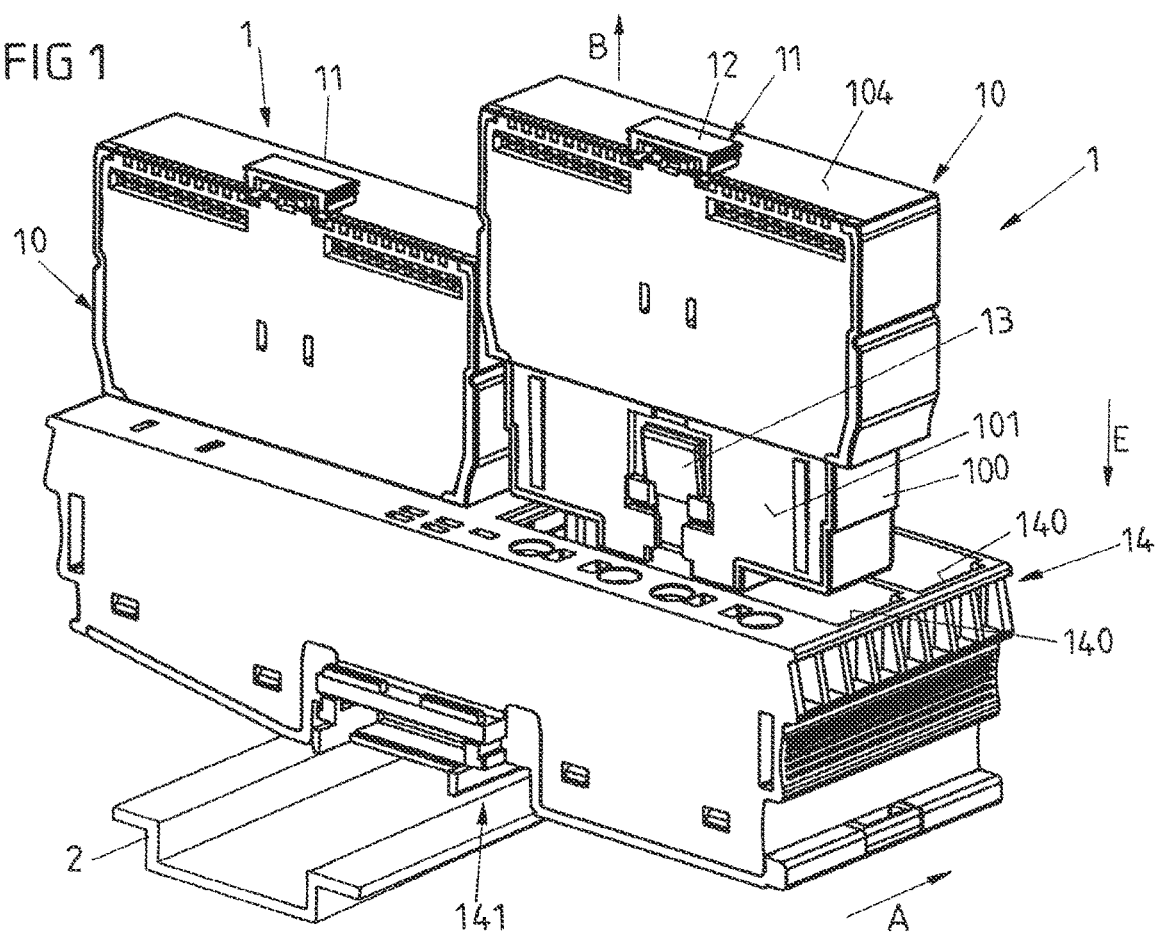
FIG. 1 is a view of an exemplary embodiment of an electrical device which has different housing sub-assemblies which can be connected to each other in a plug-in manner.
Figure 2:
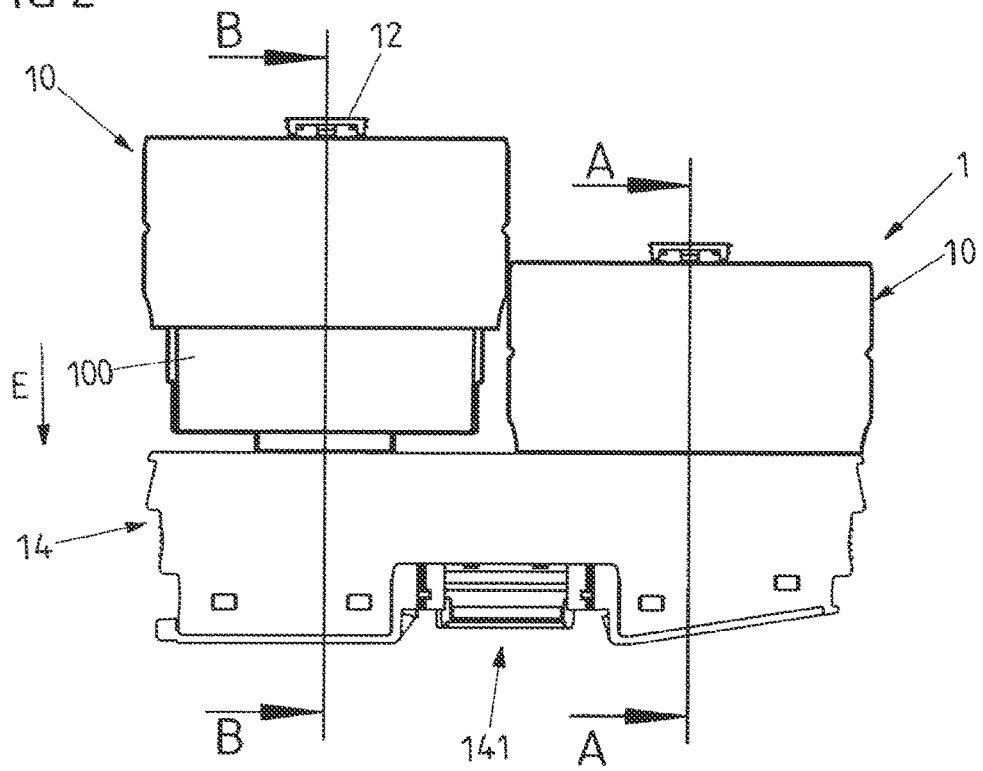
FIG. 2 is a side view of the arrangement according to FIG. 1.
Figure 3:
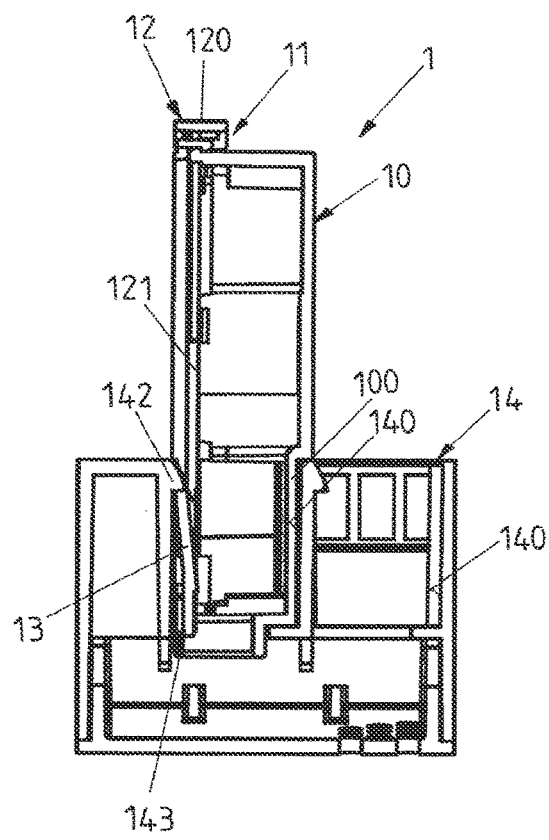
FIG. 3 is a sectional view along the line A-A according to FIG. 2.
Figure 4:
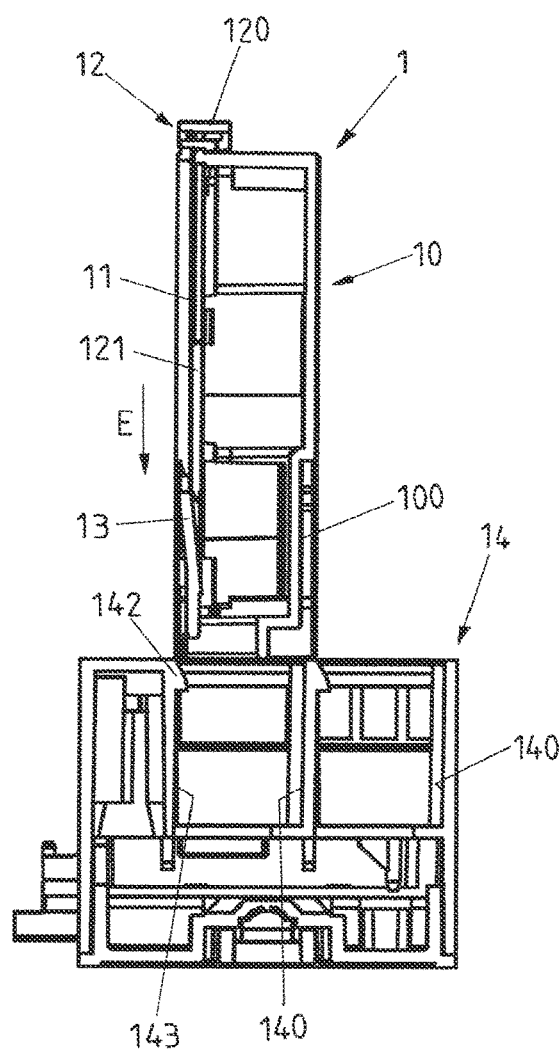
FIG. 4 is a sectional view along the line B-B according to FIG. 2.

In an embodiment, the present invention provides an electrical device which enables a simple, comfortable, reliable connection of housing sub-assemblies to each other, with a secure hold when positioned adjacent to one another and with comfortable handling for the release of the housing sub-assemblies from each other.

Accordingly, the locking device has an actuation element arranged movably along an actuation direction on the second housing sub-assembly and a locking element operatively connected to the actuation element and movably connected to the housing wall. The locking element is designed to lock the first housing sub-assembly and the second housing sub-assembly to each other when the housing sub-assemblies are adjacent to one another. The locking element can be adjusted by moving the actuation element in the actuation direction towards the housing wall in an unblocking direction directed transversely to the actuation direction towards the housing wall, in order to release the lock.

In the electrical device, locking of the housing sub-assemblies to each other when they are in a position in which they are adjacent to one another is established via the locking device, which, for this purpose, has an actuation element arranged on the second housing sub-assembly and a locking element likewise arranged on the second housing sub-assembly. The locking element serves to produce a lock when the housing sub-assemblies are adjacent to one another, in that the locking element creates an operative connection between the housing sub-assemblies and thus immobilizes the housing sub-assemblies in relation to each other.

In this case, the locking element can, preferably, automatically assume a position on the housing wall of the second housing sub-assembly which corresponds to a locking position, so that, when the housing sub-assemblies are adjacent to one another, the locking element locks automatically and thus, when the housing sub-assemblies are adjacent to one another, a connection is automatically established between the housing sub-assemblies.

The locking element can be unlocked by actuating the actuation element by moving the locking element on the housing wall in an unblocking direction directed transversely to the actuation direction when the actuation element is adjusted in the actuation direction. In this way, the lock between the housing sub-assemblies can be released so that the housing sub-assemblies can be detached from each other and thereby separated from each other.

In one development, the locking element is integrally formed with the housing wall. The locking element may be formed, for example, as a tab on the housing wall, wherein the locking element preferably is elastically adjustable in relation to the housing wall. In an initial position, when the actuation element has not been actuated, the locking element assumes a position in which the housing sub-assemblies can be locked to each other by means of the locking element. During positioning of the housing sub-assemblies adjacently to each other, the locking device thus automatically locks so that a secure and reliable connection between the housing sub-assemblies is produced.

The fact that the locking element is formed in one piece with the housing wall, e.g., as a tab, and is thus formed with the second housing sub-assembly, results in simple manufacturing in which the locking element is manufactured together with the housing wall. The housing wall can be manufactured, for example, as a plastic molding, e.g., by means of plastic injection molding, wherein the locking element is formed with the housing wall in one operation.

In one development, the locking element in a locking position assumes a first position in relation to the housing wall and projects outwardly, for example, from the housing wall. By adjusting the actuation element, the locking element can be moved into an unlocking position in which the locking element in relation to the locking position is moved inwards in the unblocking direction. In the locking position in which the locking element can lock when the housing sub-assemblies are adjacent to one another, the locking element assumes such a position in relation to the housing wall that, when the housing sub-assemblies are adjacent to one another, the locking element can engage with an associated locking section on the other, first housing sub-assembly, so that a locking between the housing sub-assemblies can be produced in this way. The locking element can be moved out of the locking position by actuating the actuation element, wherein, in the unlocking position, the locking element is adjusted inwardly in the direction of the interior of the housing of the second housing sub-assembly such that the locking connection between the housing sub-assemblies is undone, and the housing sub-assemblies can be released from their position in which they are adjacent to each other and can be detached from each other. In this case, the locking element is shifted on the housing wall in the unblocking direction that is oriented transversely to the actuation direction.

In one development, the locking element is connected to the housing wall at one connected end. If the locking element is formed in one piece and integrally with the housing wall, the locking element will be integrally formed at the connected end with the housing wall and will transition at the connected end into the housing wall. Particularly in the region of the connected end, the locking element is elastically deformable in this case for adjustment in relation to the housing wall, so that the locking element can be adjusted in relation to the housing wall by actuating the actuation element.

In the locking position, the locking element can be locked with first housing sub-assembly by means of an end edge, which is remote from the connected end, in that the end edge can be brought into locking engagement with an associated locking section of the first housing sub-assembly.

In one development, the actuation element has a blocking section which interacts with the end edge in the locking position in such a way that the blocking section blocks a movement of the end edge in the unblocking direction relative to the housing wall. The blocking section of the actuation element thus serves to secure the locking element in the locking position, so that the locking element cannot easily be brought out of the locking position—in any case, not without actuation of the actuation element. By such a blocking effect, the locked connection between the housing sub-assemblies can be secured. The blocking section can also counteract a functional impairment—for example, due to deformation or wear of the locking element.

For the purpose of blocking, the blocking section is in one development preferably arranged behind the end edge (viewed in the unblocking direction), so that the blocking section blocks a movement of the end edge in the unblocking direction. The blocking section thus engages beneath the end edge, thereby counteracting a movement of the locking element into the unlocking position.

The blocking section is formed, for example, integrally on the actuation element and takes the form of an edge on the actuation element. The blocking section can be movable relative to the end edge of the locking element by adjusting the actuation element, so that, when the actuation element is actuated, the blocking section is moved out of its operative connection to the end edge of the locking element, and thus the blocking effect is cancelled.

In one development, a bevel is formed on the blocking section on an end face facing counter to the actuation direction, said bevel being formed by a surface section on the end face that is formed at an angle to the actuation direction and obliquely to the unblocking direction. The bevel serves to simplify the creation of the operative connection between the blocking section and the end edge of the locking element when the actuation element is reset counter to the actuation direction, in that, when the actuation element is reset counter to the actuation direction, the blocking section can slide behind the end edge—optionally with the end edge running onto the bevel of the blocking section.

In one development, the actuation element is guided on the second housing sub-assembly so as to be linearly displaceable along the actuation direction. For actuation, the actuation element can thus be displaced on the housing wall so that the locking element is thereby moved in relation to the housing wall, and a locking of the housing sub-assemblies to each other is undone.

In one development, the actuation direction, in which the actuation element can be moved to unlock the housing sub-assemblies from each other, is counter to a plug-in direction in which the second housing sub-assembly can be positioned adjacent to the first housing sub-assembly for connection. This makes it possible to release the lock and detach the second housing sub-assembly from the first housing sub-assembly in one movement sequence in that, in order to release the lock, a user pulls, for example, on the actuation element in the actuation direction, thereby releasing the lock, and after release of the lock, the second housing sub-assembly comes away from the first housing sub-assembly in the actuation direction, i.e., counter to the plug-in direction. This facilitates handling for unlocking and for releasing the housing sub-assemblies from each other—in particular, also whereby no separate movement sequences are required for releasing the lock and for separating the housing sub-assemblies from each other, which in particular also makes it possible for the actuation element not to have to be held laboriously in the unlocking position until the housing sub-assemblies are released from each other, but rather that the release of the lock and the removal of the housing sub-assemblies from each other can take place in an intuitive, simple sequence. In particular, a single-handed operation is also possible as a result.

The first housing sub-assembly can, for example, be fastened to a mounting rail and for this purpose have a suitable fastening device for the locking connection to the mounting rail—for example, to a so-called top-hat rail. The plug-in direction in which the second housing sub-assembly can be positioned against the first housing sub-assembly can be oriented in the direction of the mounting rail, so that the second housing sub-assembly can be connected to the first housing sub-assembly in a plug-in manner when the first housing sub-assembly is connected to the mounting rail.

In one embodiment, the actuation element has at least one active section which is guided displaceably—in particular, linearly displaceably—on at least one side edge of the locking element. For example, the actuation element can have two active sections which are guided—in particular, linearly-displaceably guided—on side edges extending parallel to one another, e.g., on mutually-remote, outside edges of the locking element or on mutually-facing edges of a slot in the locking element. The active sections can be formed, for example, as sliding sections which are slidably movable on the side edges and, upon actuation of the actuation element in the actuation direction, run onto the side edges such that the locking element is moved in the unblocking direction for unlocking the connection between the housing sub-assemblies. By means of the active sections, a force deflection of the movement of the locking element in the actuation direction into a movement of the locking element in the unblocking direction oriented transversely to the actuation direction thus takes place, in that the active sections run onto the side edges of the locking element when the actuation element is actuated and thereby move the locking element in the unblocking direction.

In one development, a spring element is arranged on the second housing sub-assembly and pretensions the actuation element counter to the actuation direction in relation to the second housing sub-assembly. An actuation of the actuation element for unlocking the housing sub-assemblies from each other thus takes place against the spring pretension of the spring element, which can, for example, take the form of a tension spring or compression spring. After actuation has taken place, due to the spring effect of the spring element, the actuation element is automatically returned to a non-actuated starting position in which the locking element assumes the locking position, and thus the housing sub-assemblies are able to lock together upon being positioned adjacent to one another.

The spring element can be accommodated, for example, in an associated recess in the actuation element and bring about a spring pretension between the actuation element and the housing wall of the second housing sub-assembly.

In one development, the first housing sub-assembly, which can be formed, for example, by a base housing attachable to a mounting rail, has a plug-in opening into which the second housing sub-assembly can be inserted with a plug-in section. When the housing sub-assemblies are adjacent to one another, the plug-in section is received in the plug-in opening, so that the housing sub-assemblies are connected to each other.

The locking element can be formed on the plug-in section, wherein in this case the housing wall on which the locking element is arranged extends along the plug-in section and is formed, for example, by a longitudinal wall of the second housing sub-assembly (which is longer than an end-face, short wall of the second housing sub-assembly).

In one development, the first housing sub-assembly has a wall facing the slot and a detent section formed on the wall, e.g., in the form of a detent lug, with which the locking element is engaged for locking when the housing sub-assemblies are adjacent to one another. During positioning of the housing sub-assemblies adjacently to one another, the locking element slides, for example, over the detent section and a sloped ramp formed therein so that, when the housing sub-assemblies are connected to each other in a plug-in manner, the locking element automatically engages with the detent section for locking. In the locking position, the locking element engages positively with the detent section so that the housing sub-assemblies are thereby secured to each other counter to the plug-in direction. By actuating the actuation element, the locking element can be pulled in the unblocking direction oriented transversely to the actuation direction and disengaged from the detent section, so that the housing sub-assemblies can be released again from each other.

The housing sub-assemblies can be positioned adjacent to one another when the actuation element is not actuated. For this purpose, the housing wall of the second housing sub-assembly and/or the wall of the first housing sub-assembly on which the detent section is formed have sufficient elasticity to enable the locking element of the second housing sub-assembly to be moved past the detent section of the first housing sub-assembly when the housing sub-assemblies are adjacent to one another, even when the actuation element is not actuated, in order to snap into positive engagement with the detent section.

In one development, the actuation element has a head which is arranged in the region of a head end, facing away from the plug-in section, of the second housing sub-assembly. The head of the actuation element can thereby be accessible from an end of the second housing sub-assembly facing away from the plug-in section, so that the actuation element is actuated by grasping the head, and the lock between the housing sub-assemblies can thereby be released.

An electrical device of the type described above can in particular assume an automation function—for example, in the context of an industrial plant or in the field of building automation. An electrical device of the type described can be mounted, for example, in a switchgear cabinet, wherein, for this purpose, the first housing sub-assembly can, for example, be fastened to a mounting rail so that the electrical device can be arranged as a whole on a mounting rail and, where applicable, be combined with further electrical devices.

However, it is also conceivable to use the electrical device independently of a mounting rail—for example, by fastening the electrical device to a wall of a switchgear cabinet.

The idea behind the invention is explained in more detail below on the basis of the exemplary embodiments shown in the figures. The following are shown:

In an exemplary embodiment of an electrical device 1 shown in FIGS. 1 through 4, a housing sub-assembly 14 in the form of a housing base can be arranged on a mounting rail 2 by means of a fastening device 141 and, on the mounting rail 2, for example, along a lining-up direction A, can be combined with other electrical devices of the same or different design, in order in this way to create an electrical functional sub-assembly which can, for example, assume automation functions in the field of an industrial plant or of building automation.

The housing sub-assembly 14 represents a housing base which, for example, can have terminals for connecting electrical lines. On the housing sub-assembly 14, in the illustrated exemplary embodiment, several plug-in openings 140 (in the illustrated exemplary embodiment, four plug-in openings 140) are formed, into which modular housing sub-assemblies 10 can be inserted to mechanically connect and to electrically contact the housing sub-assemblies 10 to the housing sub-assembly 14.

The housing sub-assemblies 10 may each, for example, contain an electronic unit so that, by attachment to the housing sub-assembly 14 in the form of the housing base, various electrical and/or electronic functions can be made available on the electrical device 1 in a modular manner.

The housing sub-assemblies 10 in each case have a plug-in section 100 with which the respective housing sub-assembly 10 can be plugged into an associated plug-in opening 140 in the housing sub-assembly 14 along a plug-in direction E, in order to thereby connect the housing sub-assembly 10 to the housing sub-assembly 14.

Each housing sub-assembly 10 has a locking device 11, which serves, when the housing sub-assembly 10 is adjacent to the housing sub-assembly 14, to lock the same to the housing sub-assembly 14 in such a way that the housing sub-assembly 10 is fastened to the housing sub-assembly 14 in a positive-locking manner counter to the insertion direction E, and is thus mechanically held on the housing sub-assembly 14. The locking device 11 can be released in order to remove the housing sub-assembly 10 from the housing sub-assembly 14 counter to the plug-in direction E.

In order to form the locking device 11, a locking element 13 is arranged on the housing sub-assembly 10, said element being formed in one piece and integrally with a housing wall 101 of the housing sub-assembly 10 and being operatively connected to an actuation element 12 that can be displaced along an actuation direction B in relation to the housing wall 101.

Figure 5:
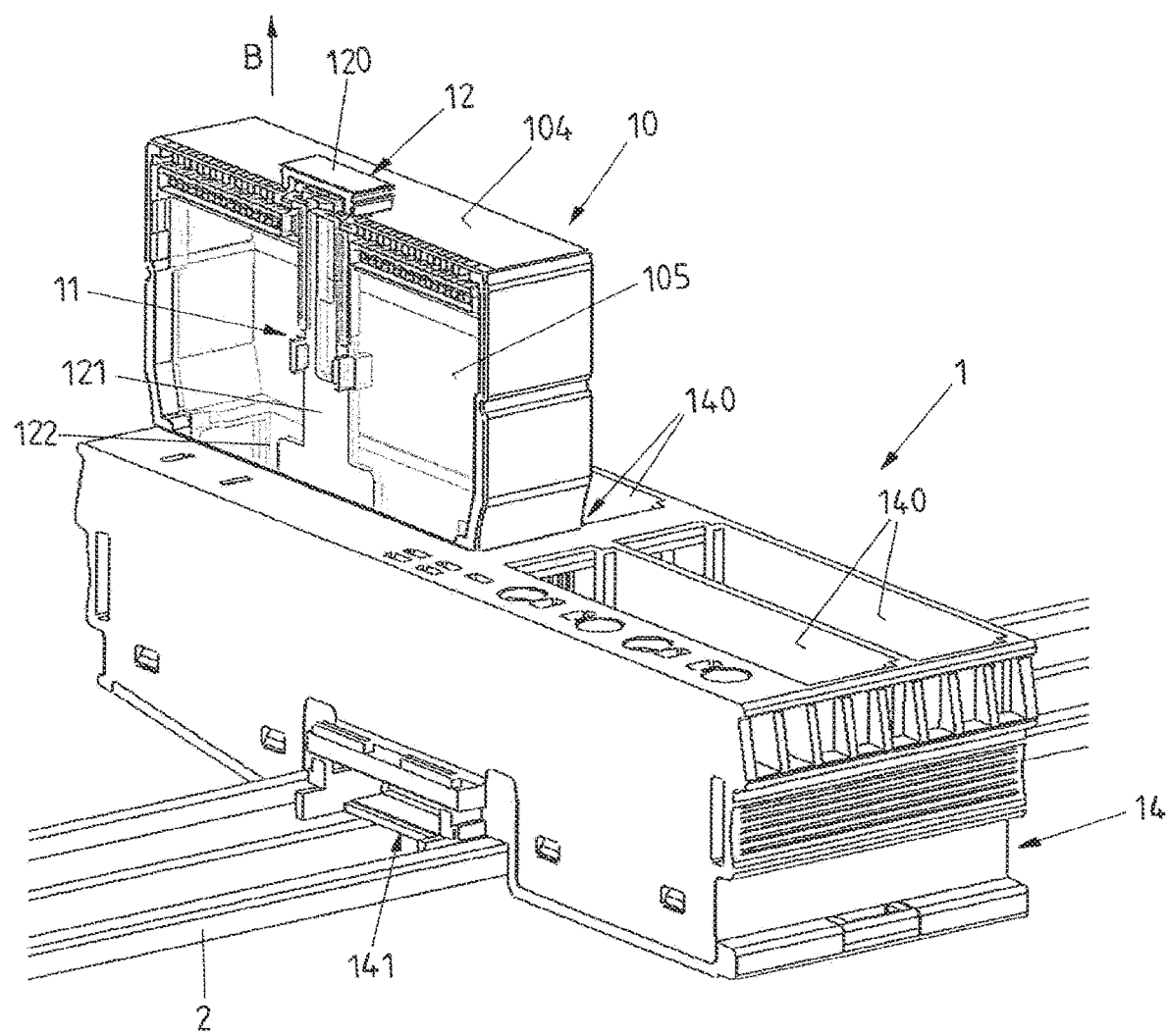
FIG. 5 is another view of the electrical device, in a position of two housing sub-assemblies are adjacent to one another.
Figure 6:
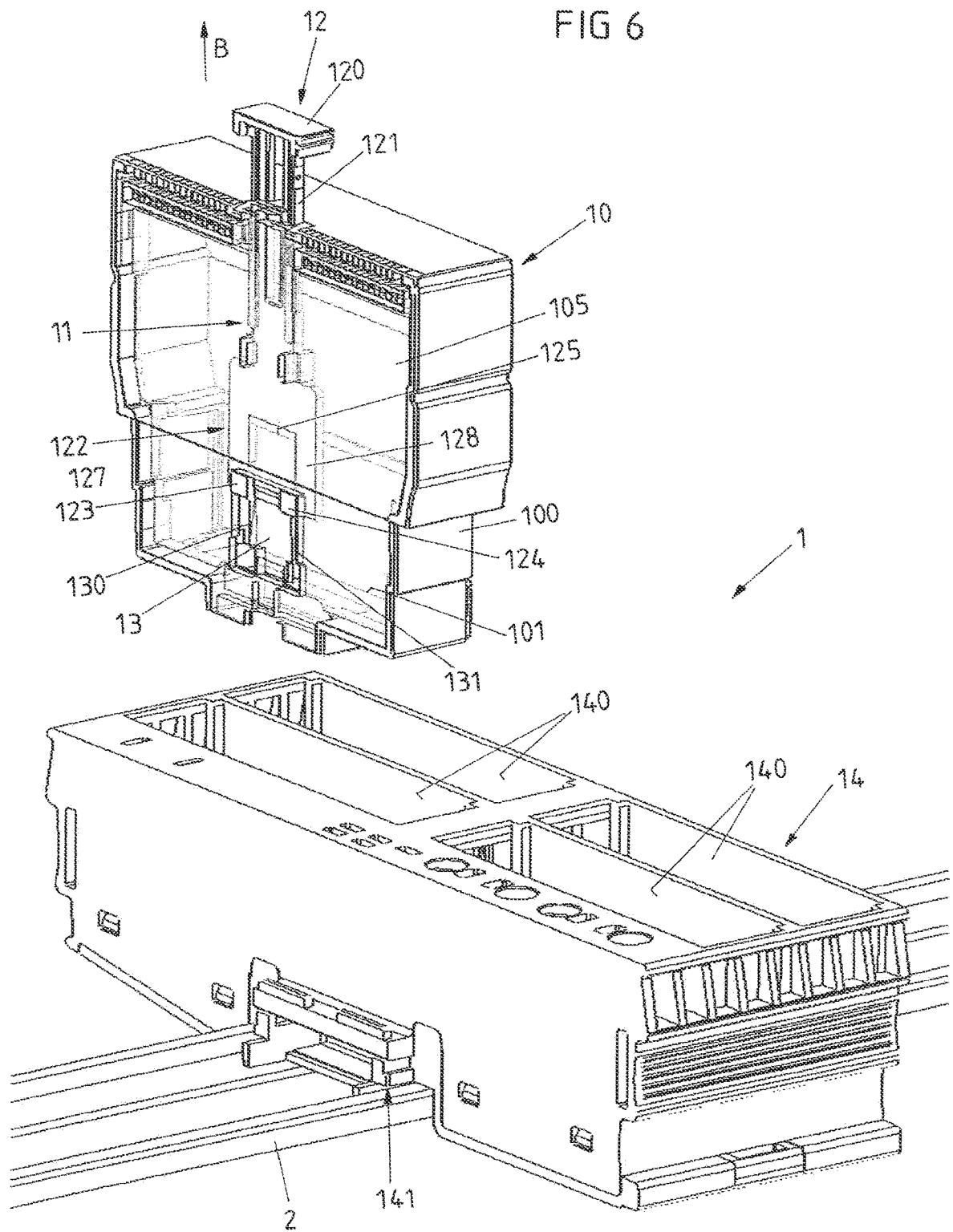
FIG. 6 is a view of the arrangement according to FIG. 5, with housing sub-assemblies separated from each other.
Figure 7:
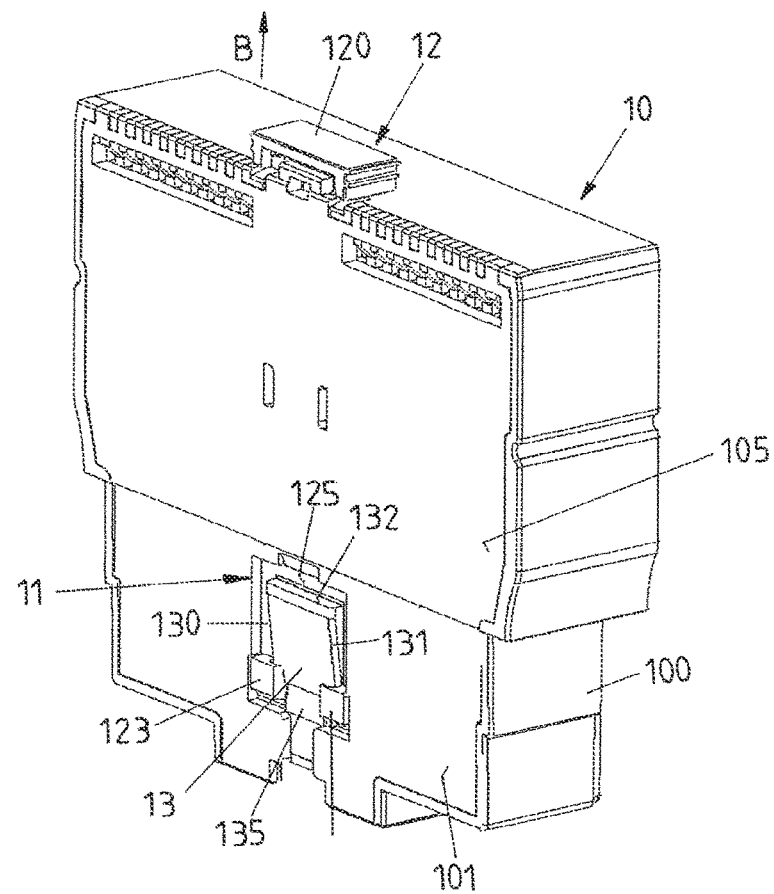
FIG. 7 is a separate view of one of the housing sub-assemblies.
Figure 8:
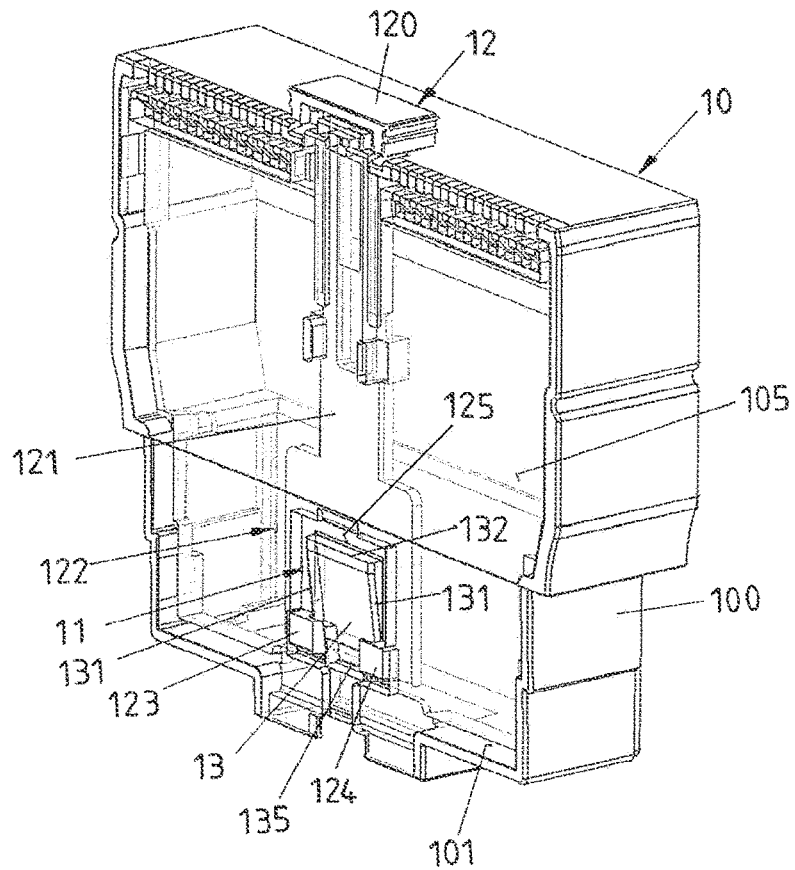
FIG. 8 is a partially transparent view of the housing sub-assembly according to FIG. 7.
Figure 14:
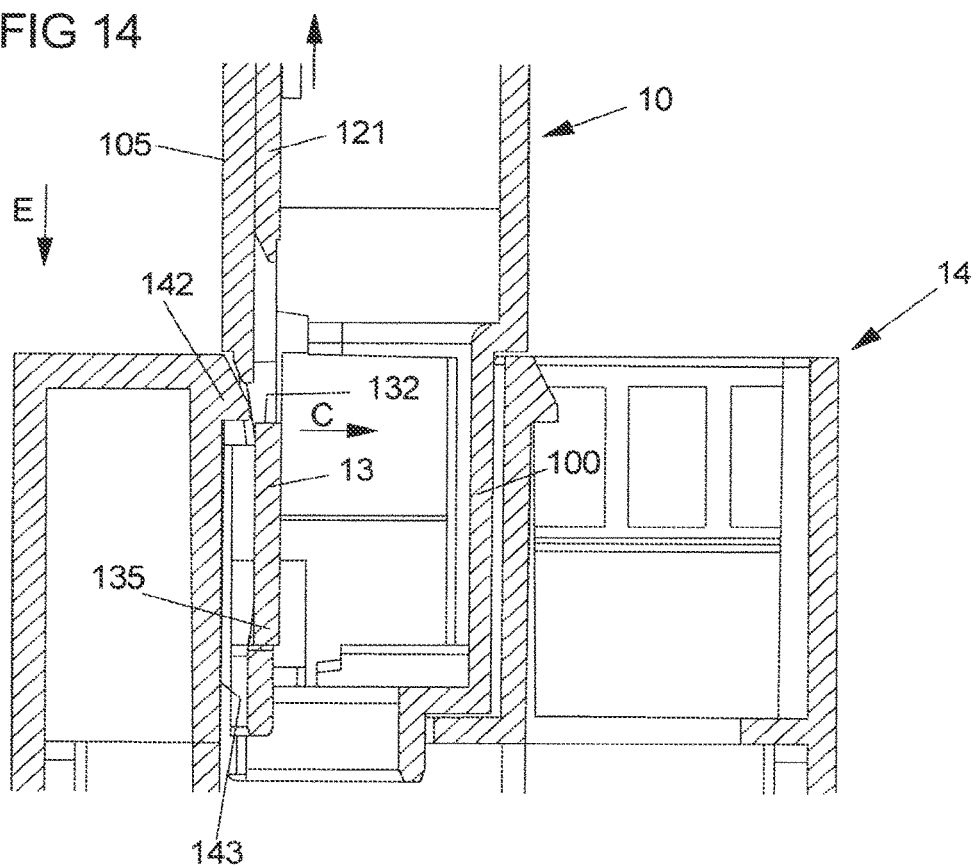
FIG. 14 is a sectional view along the line B-B according to FIG. 11, with the actuation element in an actuation position.
Figure 15:
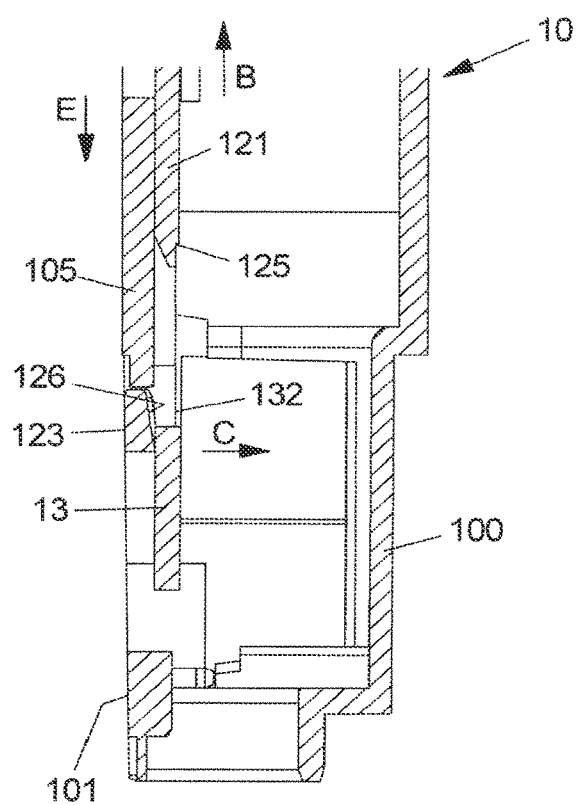
FIG. 15 is a sectional view along the line A-A according to FIG. 11, with the actuation element in the actuation position.

With reference to FIGS. 5 through 15, the actuation element 12 has an actuation head 120 which is arranged in the region of a head end 104, facing away from the plug-in section 100, of the respectively associated housing sub-assembly 10, as can be seen, for example, from FIG. 5. The head 120 is formed on a shaft section 121 which, at an end remote from the head 120, forms a foot section 122 formed by legs 127, 128 and active sections 123, 124 formed on the legs, as can be seen, for example, from FIG. 11.

The actuation element 12 is guided in a linearly-displaceable manner along the actuation direction B on the housing wall 101, which is implemented by a housing part 105 of the housing sub-assembly 10 that is to be connected to a housing box. Via the active sections 123, 124 of the foot section 122, the actuation element 12 is operatively connected to the locking element 13 which is formed in the region of the plug-in section 100 on the housing wall 101, said locking element, as can be seen from FIG. 11, being integrally formed with the housing wall 101—for this purpose, being connected to the housing wall 101 at a connected end 135 and with an end edge 132 is remote from the connected end 135. The locking element 13 is arranged within a recess 103 of the housing wall 101 and is elastically adjustable within the opening 103 in relation to the housing wall 101.

As can be seen from FIGS. 7, 8 and FIGS. 9, 10, the active sections 123, 124 of the actuation element 12 slide on side edges 130, 131 of the locking element 13. At lower ends of the side edges 130, 131 facing the connected end 135, recesses 133, 134 are in this case formed in the locking element 13 which enable mounting of the actuation element 12 while establishing the operative connection between the active sections 123, 124 and the locking element 13.

As can be seen from the sectional views according to FIGS. 12 and 13, the locking element 13 is positioned obliquely to the housing wall 101 in a locking position, and its free end edge 132 faces outwards. In the locking position, the locking element 13 can establish locking to a detent section 142 on a wall 143 within the plug-in opening 140 of the housing sub-assembly 14 in that, when the housing sub-assembly 10 is plugged into an associated plug-in opening 140 of the housing sub-assembly 14 in the plug-in direction E, the locking element 13 runs onto the detent section 142 and, after passing the detent section 142, snaps into engagement with the detent section 142, as can be seen in particular from FIG. 13. In the locking position, a positive connection between the housing sub-assemblies 10, 14 is thus established when the housing sub-assemblies 10, 14 are adjacent to one another, so that the housing sub-assemblies 10, 14 are fastened to each other counter to the plug-in direction E.

As can be seen from FIGS. 12 and 13 in conjunction with FIG. 11, the actuation element 12 forms, at the foot section 122 between the legs 127, 128, a blocking section 125 which, in the locking position of the actuation element 12, engages beneath the locking element 13 such that the locking element 13 is blocked in an unblocking direction C. The blocking section 125 comes to lie behind the end edge 132 of the locking frame 13 in the unblocking direction C, so that the actuation element 12 supports the locking element 13 counter to the unblocking direction C and thus holds it in the locking position.

A bevel which is oriented obliquely to the actuation direction B and to the unblocking direction C is formed on the blocking section 125. Using the bevel, the blocking section 125 can run onto the end edge 132 when the actuation element 12 is moved into the locking position, so that support of the blocking section 125 at the end edge 132 of the locking element 13 can be provided thereby.

By actuating the actuation element 12 in the actuation direction B, the locking element 13 can be unlocked. During actuation of the actuation element 12, the active sections 123, 124 slide on the side edges 130, 131 of the locking element 13 with a bevel 126 in each case formed on the inside of the respective active section 123, 124 (see FIG. 11) and thereby elastically move the locking element 13 inwardly in relation to the housing wall 101 in the unblocking direction C, as can be seen in the transition from FIGS. 12, 13 to FIGS. 14, 15. As can be seen from FIG. 14, the end edge 132 of the locking element 13 is thereby disengaged from the latching section 142 on the wall 143 of the housing sub-assembly 14 so that the housing sub-assemblies 10, 14 can be detached from each other counter to the plug-in direction E.

The actuation direction B in which the actuation element 12 is to be actuated in order to unlock the locking device 11 is counter to the plug-in direction E. In order to actuate the actuation element 12, a user can, for example, pull the head 120 of the actuation element 12 in order in this way to shift the actuation element 12 in the actuation direction B on the housing sub-assembly 10. The housing sub-assembly 10 is then detached from the housing sub-assembly 14 in the actuation direction B so that the actuation of the actuation element 12 and the removal of the housing sub-assembly 10 from the housing sub-assembly 14 can take place in one movement sequence, and thus in one operation.

As shown in an exemplary embodiment in FIGS. 16 and 17, the actuation element 12 can be spring-elastically pre-tensioned with respect to the housing sub-assembly 10 by means of a spring element 136. For this purpose, the spring element 136 can be accommodated, for example, in a recess 129 in the form of a receiving groove on the shaft section 121 of the actuation element 12 and be supported, with one end, on a bottom 129A of the recess 129 at the transition to the foot section 122 and, with the other end, on a support section 106 which is formed on the housing part 105 and engages as a projection in the recess 129 in the form of the receiving groove.

In the exemplary embodiment shown, the spring element 136 takes the form of a compression spring and pretensions the actuation element 12 in the direction of the locking position (FIG. 16). When the actuation element 12 is moved in the actuation direction B for unlocking, the spring element 136 is tensioned under pressure (FIG. 17) due to a change in distance between the bottom 129A of the recess 129 and the support section 106 on the housing part 105 along the actuation direction B. The tension on the spring element 136 causes the actuation element 12, after actuation, to be automatically returned to the locking position (FIG. 16) counter to the actuation direction B.

This makes it possible for the actuation element 12, after actuation, to automatically return to its initial position assigned to the locking position of the locking element 13, i.e., the actuation element 12, after actuation, is reset again counter to the actuation direction B.

Such a spring element 136 may be advantageous for simplified operation. However, such a spring element 136 may also be dispensed with. When the housing sub-assembly 10 is adjacent to the housing sub-assembly 14 in the plug-in direction E, and, should the actuation element 12 not be in its initial position assigned to the locking position of the locking element 13, a user will usually press on the head 120 of the actuation element 12 and thus bring the actuation element 12 into the position assigned to the locking position of the locking element 13.

Because the locking element 13 is formed in one piece and integrally with the housing wall 101, and the actuation element 12 is in addition simply constructed and easy to manufacture, a locking device 11 of simple design results, with a reliable and firm connection when the housing sub-assemblies 10, 14 are adjacent to one another and with a simple, comfortable handling, not only for connecting the housing sub-assemblies 10, 14 to each other, but also for unlocking and releasing the housing sub-assemblies 10, 14 from each other.

The housing wall 101 of the housing sub-assembly 10 and the wall 143 within the plug-in opening 140 of the housing sub-assembly 14 can have—transversely to the actuation direction B—such an elasticity that the housing sub-assembly 10 can be plugged in the plug-in direction E into the housing sub-assembly 14 even when the actuation element 12 has not been actuated. In particular, the housing wall 101 can be formed in such a way that the locking element 13 can divert when the actuation element 12 is in the initial position according to FIGS. 12 and 13, such that the locking element 13 can be moved past the detent section 142 until the locking element 13 snaps into engagement with the detent section 142.

The idea upon which the invention is based is not limited to the exemplary embodiments described above, but can also be implemented in another manner.

A locking device of the type described can be used to connect entirely different housing sub-assemblies to each other and is therefore not limited to one housing sub-assembly to be connected to one housing base. A locking device of the type described can be used for locking wherever housing sub-assemblies are in a position in which they are adjacent to one another with walls facing each other, so that a locking connection can be established via a locking element.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Electrical device
10 Housing sub-assembly (module housing)
100 Plug-in section
101, 102 Wall
103 Opening
104 Head end
105 Housing part
106 Support section
11 Locking device
12 Actuation element
120 Head
121 Shaft section
122 Foot section
123, 124 Active section
125 Blocking section
126 Bevel
127, 128 Leg
129 Recess (receiving groove)
129A Bottom
13 Locking element
130, 131 Side edge
132 End edge
133, 134 Recess
135 Connected end
136 Spring element
14 Housing sub-assembly (base part)
140 Plug-in opening
141 Fastening device
142 Detent section
143 Wall
2 Mounting rail
A Lining-up direction
B Actuation direction
C Unblocking direction
E Plug-in direction

The invention claimed is:

1. An electrical device, comprising:
a first housing sub-assembly;
a second housing sub-assembly that has a housing wall; and
a locking device,
wherein the first housing sub-assembly and the second housing sub-assembly are positionable adjacent to one another along a plug-in direction and, when in a position in which they are adjacent to one another, are interlocked via the locking device,
wherein the locking device has an actuation element arranged on the second housing sub-assembly so as to be adjustable along an actuation direction, and a locking element connected adjustably to the housing wall and operatively connected to the actuation element,
wherein the locking element is configured, in the position of the housing sub-assemblies in which they are adjacent to one another, to interlock the first housing sub-assembly and the second housing sub-assembly, and, by moving the actuation element in the actuation direction towards the housing wall, are movable in an unblocking direction, oriented transversely to the actuation direction, towards the housing wall in order to release the lock, and
wherein the locking element in a locking position assumes a first position in relation to the housing wall and, by adjusting the actuation element, is movable into an unlocking position in which the locking element, relative to the locking position, is moved in the unblocking direction towards the housing wall.

2. The electrical device of claim 1, wherein the locking element is formed in one piece with the housing wall.

3. The electrical device of claim 1, wherein the locking element is formed as a tab on the housing wall.

4. The electrical device of claim 1, wherein the locking element is movable elastically in relation to the housing wall.

5. The electrical device of claim 1, wherein the locking element at a connected end is connected to the housing wall and, in the locking position, is lockable with an end edge remote from the connected end to the first housing sub-assembly.

6. The electrical device of claim 5, wherein the actuation element has a blocking section which, in the locking position, is configured to interact with the end edge such that the blocking section blocks a movement of the end edge in the unblocking direction in relation to the housing wall.

7. The electrical device of claim 6, wherein the blocking section, when viewed in the unblocking direction, is arranged in the locking position behind the end edge.

8. The electrical device of claim 6, wherein the blocking section is movable by adjusting the actuation element relative to the end edge of the locking element.

9. The electrical device of claim 7, wherein the blocking section has a bevel on an end face facing counter to the actuation direction.

10. The electrical device of claim 1, wherein the actuation element is configured to be guided on the second housing sub-assembly along the actuation direction in a linearly-displaceable manner.

11. The electrical device of claim 1, wherein the second housing sub-assembly is positionable adjacent to the first housing sub-assembly in the plug-in direction, and
wherein the actuation direction for unlocking the locking element is counter to the plug-in direction.

12. The electrical device of claim 1, wherein the actuation element has at least one active section which is displaceably guidable on at least one side edge of the locking element.

13. The electrical device of claim 1, wherein the actuation element has two active sections, which are displaceably guidable on side edges, extending parallel to each other, of the locking element.

14. The electrical device of claim 1, further comprising:
a spring element, which is configured to pretension the actuation element with respect to the second housing sub-assembly counter to the actuation direction.

15. The electrical device of claim 1, wherein the first housing sub-assembly has a plug-in opening and the second housing sub-assembly has a plug-in section, and
wherein the plug-in section is insertable into the plug-in opening for positioning the first housing sub-assembly and the second housing sub-assembly adjacent to one another.

16. The electrical device of claim 15, wherein the locking element is formed on the plug-in section.

17. The electrical device of claim 15, wherein the first housing sub-assembly has a wall, facing the insertion opening, and a detent section formed on the wall, with which the locking element is in locking engagement when the housing sub-assemblies are adjacent to one another.

18. The electrical device of claim 16, wherein the actuation element has a head which is arranged in a region of a head end, facing away from the plug-in section, of the second housing sub-assembly.

\* \* \* \* \*